United States Patent
Ulion et al.

(10) Patent No.: US 7,326,470 B2
(45) Date of Patent: Feb. 5, 2008

(54) THIN 7YSZ, INTERFACIAL LAYER AS CYCLIC DURABILITY (SPALLATION) LIFE ENHANCEMENT FOR LOW CONDUCTIVITY TBCS

(75) Inventors: Nicholas E. Ulion, Marlborough, CT (US); Mladen Trubelja, Manchester, CT (US); Michael J. Maloney, Marlborough, CT (US); David A. Litton, Rocky Hill, CT (US)

(73) Assignee: United Technologies Corporation, Hartford, CT (US)

( * ) Notice: Subject to any disclaimer, the term of this patent is extended or adjusted under 35 U.S.C. 154(b) by 257 days.

(21) Appl. No.: 10/833,618

(22) Filed: Apr. 28, 2004

(65) Prior Publication Data

US 2005/0244663 A1   Nov. 3, 2005

(51) Int. Cl.
 *B32B 9/00* (2006.01)
(52) U.S. Cl. ............... 428/469; 428/472; 428/701; 428/702; 416/241 B
(58) Field of Classification Search ............... None
 See application file for complete search history.

(56) References Cited

U.S. PATENT DOCUMENTS

| | | | |
|---|---|---|---|
| 6,177,200 | B1 | 1/2001 | Maloney |
| 6,187,453 | B1 | 2/2001 | Maloney |
| 6,258,467 | B1 | 7/2001 | Subramanian |
| 6,482,537 | B1 * | 11/2002 | Strangman et al. ......... 428/633 |
| 2003/0049470 | A1 | 3/2003 | Maloney |
| 2004/0038086 | A1 | 2/2004 | Litton et al. |
| 2005/0170200 | A1 * | 8/2005 | Nagaraj et al. ............. 428/633 |

FOREIGN PATENT DOCUMENTS

| | | |
|---|---|---|
| EP | 0 825 271 A1 | 2/1998 |
| EP | 1 400 610 A1 | 3/2004 |
| JP | 2001-225411 | 8/2001 |
| JP | 2003-201586 | 7/2003 |
| RU | 2116377 | 7/1998 |
| WO | WO 02/14580 | 2/2002 |

* cited by examiner

*Primary Examiner*—Jennifer McNeil
*Assistant Examiner*—Timothy M. Speer
(74) *Attorney, Agent, or Firm*—Bachman & LaPointe

(57) ABSTRACT

A spallation resistant metallic article comprising a metallic substrate, at least one ceramic thermal barrier coating comprising a zirconia base and at least one other element selected from the group consisting of La, Ce, Pr, Nd, Sm, Eu, Gd, Tb, Dy, Ho, Er, Tm, Yb, Lu, Sc, In, Y, Mo and C, rare earth oxides, scandium, and indium, and a ceramic bond coat located on at least a portion of the substrate and between the metallic substrate and the at least one ceramic thermal barrier coating wherein the ceramic bond coat is composed of yttria stabilized zirconia (YSZ).

25 Claims, 1 Drawing Sheet

THIN 7YSZ INTERFACIAL LAYER AS CYCLIC DURABILITY (SPALLATION) LIFE ENHANCEMENT FOR LOW CONDUCTIVITY TBCS

BACKGROUND OF THE INVENTION (1) Field of the Invention

This invention relates to ceramic materials for thermal barrier coatings applied to metallic parts wherein an interfacial layer of stabilized zirconia is interposed between the part and the coating.

(2) Description of the Related Art

Gas turbine engines are well developed mechanisms for converting chemical potential energy, in the form of fuel, to thermal energy and then to mechanical energy for use in propelling aircraft, generating electric power, pumping fluids etc. At this time, the major available avenue for improved efficiency of gas turbine engines appears to be the use of higher operating temperatures. However, the metallic materials used in gas turbine engines are currently very near the upper limits of their thermal stability. In the hottest portion of modern gas turbine engines, metallic materials are used at gas temperatures above their melting points. They survive because they are air cooled. But providing air cooling reduces engine efficiency.

Accordingly, there has been extensive development of thermal barrier coatings for use with cooled gas turbine aircraft hardware. By using a thermal barrier coating (TBC), the amount of cooling air required can be substantially reduced, thus providing a corresponding increase in efficiency. One common TBC utilized to protect gas engine turbine parts comprises 59 weight percent $Gd_2O_3$–41 $ZrO_2$. While providing low thermal conductivity, such Gd-Zr based TBCs may exhibit lower spallation resistance than conventional yttria stabilized zirconia, e.g. 7YSZ. It is believed that this susceptibility to spallation arises from the lower fracture toughness characteristic of Gd-Zr systems.

In response, it has been found that incorporating an initial, thin layer (nominal 0.5-1 mil) of a different stabilized zirconia, e.g., 7YSZ enhances the spallation resistance of Gd—Zr systems. While not fully understood, such increased spallation resistance likely arises from higher fracture toughness of the 7YSZ, allowing it to resist the stresses that develop at the TBC/bond coat (or more particularly the alumina layer) interface. Another possible beneficial effect of the 7YSZ interlayer is likely related to the negation of the potentially detrimental interaction between Gadolinia and the Alumina scale that forms on the surface of the substrate alloy or bond coat. Regardless of the mechanism at work, it has been shown that the addition of a thin 7YSZ interlayer compensates for the lower fracture toughness of the Gd—Zr based TBC so as to enhance spallation resistance.

In addition to spallation resistance, there is also a need to produce a TBC which exhibits resistance to erosion. Erosion occurs when fine particulates ingested or liberated by an engine impact the TBCs at very high velocity during engine operation. This results in attrition of the TBC from its surface downward. Typically, only very small particles of TBC are eroded away with a given impact event, since only fine particles tend to make it into the turbine, as large particles are centrifuged out in the compressor. Such erosive events liberate tiny chunks of TBC per event, locally reducing the thickness of the TBC slightly. Lower thermal conductivity TBCs (such as 59 GdZr) which exhibit lower fracture toughness are prone to erosion.

However, while Gd-Zr based TBCs, in particular 59weight percent $Gd_2O_3$–41 $ZrO2$, exhibit relatively low coefficients of thermal conductivity, there is a need for TBCs which exhibit even lower thermal conductivity. Such TBCs may exhibit less spallation and erosion resistance than do current systems. Such resistance to spallation would ideally manifest itself in both a resistance of the TBC to separate from the underlying part as well as a resistance for different layers comprising a TBC to separate one from another.

Generally speaking, metallic materials have coefficients of thermal expansion which exceed those of ceramic materials. Consequently, one of the problems that must be addressed in the development of successful thermal barrier coatings is to match more closely the coefficient of thermal expansion of the ceramic material to the metallic substrate so that upon heating, when the substrate expands, the ceramic coating material does not crack. Zirconia has a high coefficient of thermal expansion and this is a primary reason for the success of zirconia as a thermal barrier material on metallic substrates.

Despite the success with the current use of electron beam physical vapor deposited zirconia base coatings, there is a continuing desire for improved coatings which exhibit superior thermal insulation capabilities, especially those improved in insulation capabilities when normalized for coating density. Weight is always a critical factor when designing gas turbine engines, particularly rotating parts. Ceramic thermal barrier coatings are not load supporting materials, and consequently they add weight without increasing strength. There is a strong desire for a ceramic thermal barrier material which adds the minimum weight while providing the maximum thermal insulation capability. In addition, there are obviously the normal desires for long life, stability, economy etc.

What is therefore needed is a coated part comprising a thermal barrier coating offering lower thermal conductivity but which exhibits suitable resistance to spallation.

SUMMARY OF THE INVENTION

Accordingly, it is an object of the present invention to provide ceramic materials for thermal barrier coatings applied to metallic parts wherein an interfacial layer of 7YSZ is interposed between the part and the coating to increase the spallation resistance of the coating.

In accordance with the present invention, a spallation resistant metallic article comprises a metallic substrate, at least one ceramic thermal barrier coating comprising a zirconia base and at least one other element selected from the group consisting of La, Ce, Pr, Nd, Sm, Eu, Gd, Tb, Dy, Ho, Er, Tm, Yb, Lu, Sc, In, Y, Mo and C, rare earth oxides, scandium, and indium, and a ceramic bond coat located on at least a portion of the substrate and between the metallic substrate and the at least one ceramic thermal barrier coating wherein the ceramic bond coat is composed of yttria stabilized zirconia (YSZ).

In further accordance with the present invention, a spallation resistant metallic article comprises at least one ceramic thermal barrier coating having a thermal conductivity less than about 1.5 W/m° C.

In further accordance with the present invention a method for reducing spallation in metallic articles comprises the steps of: providing a metallic substrate, coating the metallic substrate with at least one ceramic thermal barrier coating comprising a zirconia base and at least one other element selected from the group consisting of La, Ce, Pr, Nd, Sm, Eu, Gd, Tb, Dy, Ho, Er, Tm, Yb, Lu, Sc, In, Y, Mo and C, rare earth oxides, scandium, and indium, and interposing a ceramic bond coat between the metallic substrate and the at least one ceramic thermal barrier coating wherein the ceramic bond coat is composed of yttria stabilized zirconia (YSZ).

In further accordance with the present invention, a spallation resistant metallic article comprises a metallic substrate, at least one ceramic thermal barrier coating comprising a zirconia base and at least one other element selected from the group consisting of La, Ce, Pr, Nd, Sm, Eu, Gd, Tb, Dy, Ho, Er, Tm, Yb, Lu, Sc, In, Y, Mo and C, rare earth oxides, scandium, and indium, a ceramic bond coat between the metallic substrate and the at least one ceramic thermal barrier coating wherein the ceramic bond coat is composed of yttria stabilized zirconia (YSZ), a thermally grown oxide (TGO) layer interposed between the metallic substrate and the ceramic bond coat, and a metallic bond coat layer between the TGO layer and the metallic substrate.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference numbers and designations in the various drawings indicate like elements.

DETAILED DESCRIPTION

It is therefore a teaching of the present invention to provide a metallic article having a metal substrate, preferably a gas turbine engine component, comprising a ceramic thermal barrier coating (TBC) and a ceramic bond coat of a stabilized zirconia interposed between the ceramic TBC and the metal substrate. A preferred ceramic bond coat is 7YSZ although other yttria stabilized zirconia, e.g., stabilized zirconia including about 1-20 wt. % yttria. The ceramic TBC in all cases comprises zirconia base to which has been added one or more of the following elements: La, Ce, Pr, Nd, Sm, Eu, Gd, Tb, Dy, Ho, Er, Tm, Yb, Lu, Sc, In, Y, Mo and C, rare earth oxides, scandium, and indium wherein the elements are present from 1-50, and preferably 2-40 mole % of the $M_2O_3$ oxide where M refers to the listed elements. The yttria stabilized zirconia (YSZ) exhibits desirable mechanical integrity allowing it to withstand the stresses generated when the metallic article to which it is attached is thermally cycled. As a result, the ceramic bond coat of YSZ acts as a stabilizing bridge between the metallic article and the ceramic TBC thus increasing the spallation resistance of the ceramic TBC.

Figure 1:
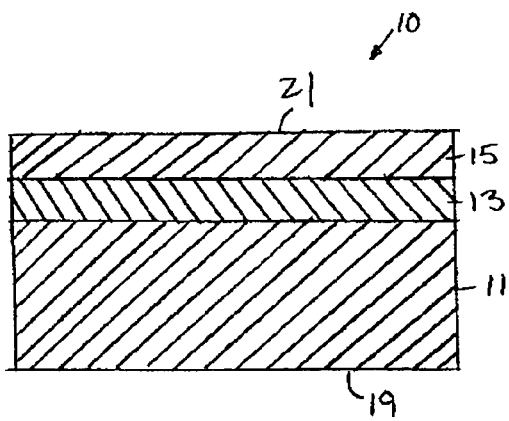
FIG. 1 Depicts a ceramic bond coat layer interposed between a ceramic coating and a metallic substrate of the present invention.

With reference to FIG. 1, there is illustrated the configuration of the metallic part 10 of the present invention consisting of metallic substrate 11 forming the metal article, the ceramic TBC, and the ceramic bond coat. The article may also include a metallic bond bond coat between the substrate and ceramic bond coat, such as an overlay (MCrAlY) bond coat or an aluminde which may also include precious metal. Alternatively, the substrate may comprise a material capable of forming an adherent alumina layer and thus not need a metallic bond coat. Metallic substrate 11 forms the part to be coated with ceramic TBC 15. Preferably, metallic substrate 11 is formed of steels, superalloys, titanium alloys and copper alloys. As noted, a ceramic bond coat layer 13 composed of yttria stabilized zirconia (YSZ) is deposited to an outer surface of metallic substrate 11. Ceramic bond coat layer 13 is preferably between 0.5 and 3 mils in thickness, most preferably approximately one mil in thickness. Likewise, a ceramic TBC is applied to the outermost layer of ceramic bond coat layer 13.

The ceramic TBC 15 may be applied to ceramic bond coat layer 13 by a variety of processes. Such processes include, but are not limited to, thermal spray processes such as in air plasma spray (APS), low pressure plasma spray (LPPS), high velocity oxygen fuel processes (HVOF), via detonation guns (D Gun), and sputtering. A preferred method of depositing ceramic TBC 15 involves electron beam physical vapor deposition (EBPVD). Use of EBPVD offers certain advantages as use of EBPVD develops a structure suited for extreme temperature applications and is therefore more suitable for coating hot section turbine components. Thermal spray processing offers the advantage of coating large components of complex shape and is more suitable for coating components such as combustors.

In gas turbine applications, the backside 19 of the metallic substrate 11 will be cooled by cooling air (not shown) and the outer surface 21 of the ceramic TBC 15 will be exposed to elevated temperatures. Heat flow will flow from the outer surface 21 to the cooled surface backside 19 and the quantity of the heat flow will be substantially reduced by a ceramic TBC 15.

Figure 2:
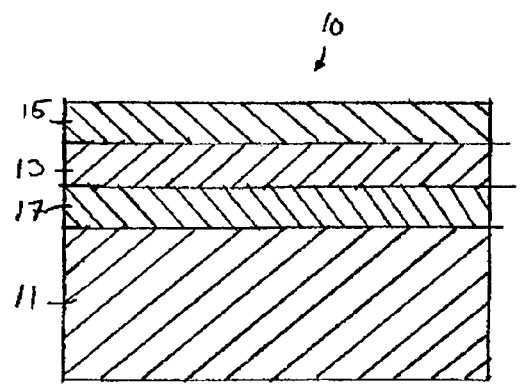
FIG. 2 Depicts a ceramic bond coat layer interposed between a ceramic coating and a thermally grown oxide (TGO) coat of the present invention.

With reference to FIG. 2, there is illustrated an alternative embodiment of the metallic part 10 of the present invention. Metallic part 10 is augmented by the addition of a thermally grown oxide (TGO) 17 interposed between metallic substrate 11 and ceramic bond coat layer 13. As before, ceramic bond coat layer 13 is preferably between approximately 0.5 and 3.0 mils in thickness, most preferably approximately 1.0 mil in thickness.

Figure 5:
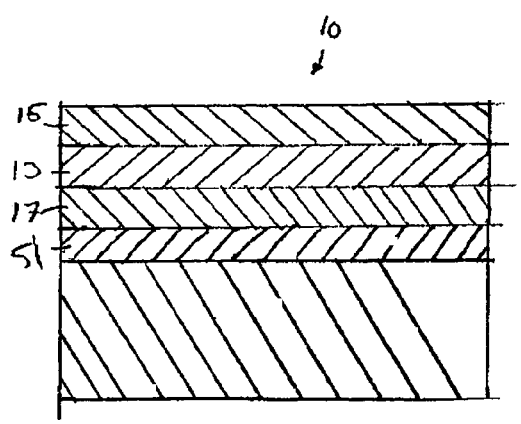
FIG. 5 Depicts a metal bond coat layer interposed between a TGO coat and a metallic substrate of the present invention.

With reference to FIG. 5, there is illustrated an alternative embodiment wherein a metal bond coat layer 51 is applied between metallic substrate 11 and ceramic bond coat layer 13. The metal bond coat layer 51 is composed of a coating containing aluminum. The composition of this metallic coating is chosen such that a continuous, thin, slow-growing aluminum oxide layer forms on the metal bond coat during operation. This aluminum oxide is universally known in the art as the thermally grown oxide or TGO. Typical metal bond coat layers 51 include NiCoCrAlY overlay coatings deposited by APS, LPPS, cathodic arc, and other techniques, as well as (Ni, Pt)Al coatings formed by electroplating Pt, then vapor coating NiAl and diffusion heat-treating the coatings to form (Ni, Pt)Al. As noted above, in the absence of a metal bond coat layer 51, a TGO layer 17 forms between the metallic substrate 11 and the ceramic bond coat layer 13. For systems with metallic bond coat layers 51, this TGO layer 17 forms between the metallic bond coat layer 51 and the ceramic bond coat layer 13. TGO layer 17 thickness are typically 0.1-0.5 microns thick on an as-ceramic-coated part, and grow to a thickness of 10 microns in service. The TGO layer 17 is responsible for providing the superalloy part with oxidation resistance, since oxygen diffuses through aluminum oxide very slowly.

Figure 3:
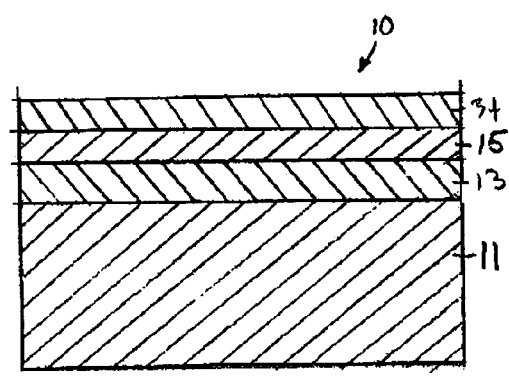
FIG. 3 Depicts an embodiment of the present invention wherein an outer ceramic coat is applied.

With reference to FIG. 3, there is illustrated an alternative embodiment of the metallic part 10 of the present invention. In addition to interposing a ceramic bond coat layer 13 comprised of 7YSZ between the ceramic TBC 15 and the metallic substrate 11, there is additionally applied an outer ceramic coat 31. Outer ceramic coat 31 forms the outermost coating of the metallic substrate 11. Comprised as it is of YSZ, outer ceramic coat 31 possesses inherently good mechanical integrity and serves to further enhance spallation resistance to stresses experienced by metallic part 10 under operation. In addition, outer ceramic coat 31 decreases the tendency for the outermost surface of metallic part 10 to erode. Outer ceramic coat 31 is preferably between approximately 0.5 and 3.0 mils in thickness, more preferably approximately 1.0 mil in thickness.

Figure 4:
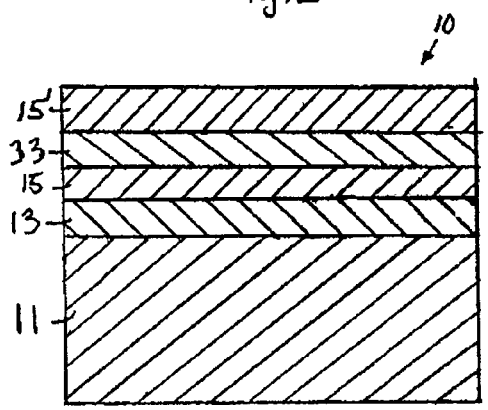
FIG. 4 Depicts an embodiment of the present invention wherein a ceramic layer of YSZ is interposed between two ceramic thermal barrier coatings.

With reference to FIG. 4, there is illustrated an alternative embodiment of the metallic part 10 of the present invention wherein at least two layers of ceramic TBC 15, 15' are deposited upon metallic substrate 11, and more specifically upon the ceramic bond coat layer 13 separating metallic substrate 11 from the ceramic TBCs 15, 15'. Separating the two ceramic TBCs 15, 15' is a ceramic layer 33 comprised of YSZ. Ceramic layer 33 comprised of YSZ, preferably 7YSZ, between two ceramic TBCs 15 serves to increase the mechanical integrity by which the ceramic TBCs 15, 15' are attached one to the other. As a result, an overall increase in the resistance of the multiple ceramic TBCs 15, 15' to spallation is increased. Ceramic layer 33 is preferably between 0.5 and 3.0 mils, most preferably approximately 1.0 mils in thickness.

EB-PVD coating trials using two electron beam guns was performed wherein a variety of compositions were applied to a metallic substrate 11 to form a ceramic thermal barrier. Resistance to spallation was measured for each composition so as to arrive at a baseline value for spallation of each composition. Next, a YSZ ceramic bond coat, specifically a 7YSZ bond coat, of approximately 1 mil in thickness was interposed between the metallic substrate 11 and the ceramic thermal barrier. Resistance to spallation was again measured and compared to the baseline values. The compositions comprising the EBPVD applied TBCs and the process by which they were formed are as follows:

7YSZ layered with Mo (One gun constantly evaporating 7YSZ, the other alternating between 7YSZ and Mo).
7YSZ with uniform Mo (One gun constantly evaporating 7YSZ, the other constantly evaporating Mo).
7YSZ layered with C (One gun constantly evaporating 7YSZ, the other alternating between 7YSZ and C).
7YSZ with uniform C (One gun constantly evaporating 7YSZ, the other constantly evaporating C).
59 GdZr layered with Mo (One gun constantly evaporating 59 GdZr, the other alternating between 59 GdZr and Mo).
59 GdZr with uniform Mo (One gun constantly evaporating 59 GdZr, the other constantly evaporating Mo).
59 GdZr layered with C (One gun constantly evaporationg 59 GdZr, the other alternating between 7YSZ and C).
59 GdZr with uniform C (One gun constantly evaporating 59 GdZr, the other constantly evaporating C).

In all instances, use of a pure 7YSZ ceramic bond coat layer approximately 1 mil thick improved spallation resistance to equivalent or better than the baseline. Spallation resistance of the 7YSZ ceramic bond coat layer enhanced compositions were measured to be between 150 and 300 hours.

One or more embodiments of the present invention have been described. Nevertheless, it will be understood that various modifications may be made without departing from the spirit and scope of the invention. Accordingly, other embodiments are within the scope of the following claims.

What is claimed is:

1. A spallation resistant metallic article comprising:
   a metallic substrate;
   at least one ceramic thermal barrier coating consisting of a zirconia base and at least one other element selected from the group consisting of La, Ce, Pr, Nd, Sm, Eu, Gd, Tb, Dy, Ho, Er, Tm, Yb, Lu, Sc, In, Mo and C;
   a first ceramic bond coat between said metallic substrate and said at least one ceramic thermal barrier coating wherein said first ceramic bond coat is composed of yttria stabilized zirconia (YSZ); and
   a thermally grown oxide (TGO) layer being interposed between said metallic substrate and said first ceramic bond coat, said thermally grown oxide (TGO) layer contacting a surface of said metallic substrate.

2. The article of claim 1 wherein the metallic substrate is selected from the group consisting of steels, superalloys, titanium alloys and copper alloys.

3. The article of claim 1 wherein said first ceramic bond coat has a thickness between approximately 0.5 and 3.0 mils.

4. The article of claim 3 wherein said thickness is approximately 1.0 mils.

5. The article of claim 1 wherein an outer ceramic coat is applied to an outside surface of said at least one ceramic thermal barrier coating, said outer ceramic coat comprising a zirconia base and at least one other element selected from the group consisting of Sm, La, Yb, Ce, Lu, Mo, rare earth oxides, yttrium, scandium, indium and combinations thereof.

6. The article of claim 1 wherein a ceramic bond coat is interposed between two of said at least one ceramic thermal barrier coating and said ceramic bond coat composed of YSZ.

7. The article of claim 6 wherein said ceramic bond coat has a thickness between approximately 0.5 and 3.0 mils.

8. The article of claim 7 wherein said thickness is approximately 1.0 mils.

9. The article of claim 1 wherein said at least one ceramic thermal barrier coating is applied by a process selected from the group consisting of thermal spraying, sputtering, and electron beam physical vapor deposition (EBPVD).

10. The article of claim 1 wherein said at least one ceramic thermal barrier coating has a thermal conductivity less than about 1.5 W/m° C.

11. The article of claim 1 wherein the article defines a gas turbine engine component.

12. The article of claim 1 wherein said metallic substrate is formed of a nickel based superalloy capable of forming an alumina layer.

13. A spallation resistant metallic article comprising:
    a metallic substrate;
    at least one ceramic thermal barrier coating consisting of a zirconia base and at least one other element selected from the group consisting of Ce, Pr, Sm, Eu, Tb, Ho, Tm, Lu, Sc, In, Mo and C;
    a first ceramic bond coat between said metallic substrate and said at least one ceramic thermal barrier coating wherein said first ceramic bond coat is composed of yttria stabilized zirconia (YSZ);

a thermally grown oxide (TGO) layer interposed between said metallic substrate and said first ceramic bond coat; and a metallic bond coat layer between said TGO layer and said metallic substrate.

14. The article of claim 13 wherein the metallic substrate is selected from the group consisting of steels, superalloys, titanium alloys and copper alloys.

15. The article of claim 13 wherein said first ceramic bond coat has a thickness between approximately 0.5 and 3.0 mils.

16. The article of claim 15 wherein said thickness is approximately 1.0 mils.

17. The article of claim 13 wherein an outer ceramic coat is applied to an outside surface of said at least one ceramic thermal barrier coating, said outer ceramic coat comprising a zirconia base and at least one other element selected from the group consisting of Sm, La, Yb, Ce, Lu, Mo, rare earth oxides, yttrium, scandium, indium and combinations thereof.

18. The article of claim 13 wherein a ceramic bond coat is interposed between two of said at least one ceramic thermal barrier coating and said ceramic bond coat composed of YSZ.

19. The article of claim 18 wherein said ceramic bond coat has a thickness between approximately 0.5 and 3.0 mils.

20. The article of claim 19 wherein said thickness is approximately 1.0 mils.

21. The article of claim 13 wherein said at least one ceramic thermal barrier coating is applied by a process selected from the group consisting of thermal spraying, sputtering, and electron beam physical vapor deposition (EBPVD).

22. The article of claim 13 wherein said at least one ceramic thermal barrier coating has a thermal conductivity less than about 1.5 W/m° C.

23. The article of claim 13 wherein the article defines a gas turbine engine component.

24. The article of claim 13 wherein said metallic bond coat is formed of a material selected from the group consisting of overlay MCrAlY and aluminide.

25. The article of claim 13 wherein said metallic substrate is formed of a nickel based superalloy capable of forming an alumina layer.

* * * * *